United States Patent
Raghupathy

(10) Patent No.: US 10,771,044 B2
(45) Date of Patent: Sep. 8, 2020

(54) ON-CHIP EMULATION OF LARGE RESISTORS FOR INTEGRATING LOW FREQUENCY FILTERS

(71) Applicant: Vidatronic Inc., College Station, TX (US)

(72) Inventor: Anand Veeravalli Raghupathy, Plano, TX (US)

(73) Assignee: Vidatronic, Inc., College Station, TX (US)

( * ) Notice: Subject to any disclaimer, the term of this patent is extended or adjusted under 35 U.S.C. 154(b) by 0 days.

(21) Appl. No.: 15/250,760

(22) Filed: Aug. 29, 2016

(65) Prior Publication Data

US 2017/0063347 A1    Mar. 2, 2017

Related U.S. Application Data

(60) Provisional application No. 62/211,374, filed on Aug. 28, 2015.

(51) Int. Cl.
*H03H 19/00* (2006.01)
*H03F 3/45* (2006.01)

(52) U.S. Cl.
CPC ....... *H03H 19/004* (2013.01); *H03F 3/45475* (2013.01); *H03F 2200/261* (2013.01); *H03F 2203/45528* (2013.01)

(58) Field of Classification Search
USPC ................................................. 327/544–547
See application file for complete search history.

(56) References Cited

U.S. PATENT DOCUMENTS

| | | | | |
|---|---|---|---|---|
| 5,392,042 A * | 2/1995 | Pellon | ................... | H03M 3/404 333/166 |
| 5,552,648 A * | 9/1996 | Cook | ..................... | G06G 7/625 307/109 |
| 5,821,891 A * | 10/1998 | Shi | ........................ | H03M 3/502 341/143 |
| 5,982,315 A * | 11/1999 | Bazarjani | .............. | H03M 3/418 341/143 |
| 6,243,654 B1 * | 6/2001 | Johnson | ............... | H01R 13/665 439/620.09 |
| 6,538,491 B1 * | 3/2003 | Spanoche | ............ | H03H 19/004 327/337 |
| 6,891,429 B1 * | 5/2005 | Early | ................... | H03H 19/004 327/337 |
| 7,385,443 B1 * | 6/2008 | Denison | .................... | H03F 3/38 330/10 |

(Continued)

*Primary Examiner* — Adam D Houston
(74) *Attorney, Agent, or Firm* — Liang Legal Group, PLLC

(57) ABSTRACT

A system for processing of signals with poles that are low in frequency includes a switched capacitor circuit that includes two switches connected to an input and an output of a switching capacitor ($C_s$), respectively, in an alternating manner at a selected switching frequency ($f_{SW}$); and a filter capacitor connected between an input and the switched capacitor circuit. The filter capacitor and the switched capacitor circuit together function as a filter, thereby a pole frequency depending on a ratio of capacitance of the switching capacitor ($C_s$) and the filter capacitor, instead of an RC product.

8 Claims, 3 Drawing Sheets

(56) References Cited

U.S. PATENT DOCUMENTS

| | | | | |
|---|---|---|---|---|
| 7,391,257 B1* | 6/2008 | Denison | A61B 5/7203 |
| | | | 330/9 |
| 2003/0041084 A1* | 2/2003 | Langan | G06E 3/005 |
| | | | 708/819 |
| 2003/0146786 A1* | 8/2003 | Gulati | H03F 3/45973 |
| | | | 330/9 |
| 2005/0104654 A1* | 5/2005 | Muhammad | H04B 1/109 |
| | | | 327/552 |
| 2006/0119444 A1* | 6/2006 | Horan | H03L 7/093 |
| | | | 331/17 |
| 2007/0285166 A1* | 12/2007 | Shia | H03F 3/45928 |
| | | | 330/258 |
| 2009/0074120 A1* | 3/2009 | Toosky | H03H 11/1291 |
| | | | 375/350 |
| 2009/0091378 A1* | 4/2009 | Haridass | G06F 1/28 |
| | | | 327/554 |
| 2009/0195306 A1* | 8/2009 | Chen | H03F 3/45475 |
| | | | 330/9 |
| 2011/0012652 A1* | 1/2011 | Lamanna | H03L 7/093 |
| | | | 327/156 |
| 2011/0025386 A1* | 2/2011 | Lamanna | H03L 7/093 |
| | | | 327/156 |
| 2011/0057736 A1* | 3/2011 | Badillo | H03K 3/0315 |
| | | | 331/57 |
| 2011/0193633 A1* | 8/2011 | Yoon | A61B 5/048 |
| | | | 330/260 |
| 2012/0242374 A1* | 9/2012 | Daigle | H03K 3/3565 |
| | | | 327/108 |
| 2013/0214774 A1* | 8/2013 | Cesaretti | G01R 33/0041 |
| | | | 324/251 |
| 2014/0077982 A1* | 3/2014 | Wu | H03M 3/022 |
| | | | 341/143 |
| 2016/0056708 A1* | 2/2016 | Jin | H02M 1/143 |
| | | | 363/48 |
| 2016/0056763 A1* | 2/2016 | Zhao | H03B 5/24 |
| | | | 331/111 |
| 2016/0233908 A1* | 8/2016 | Mak | H03H 11/1291 |
| 2017/0063347 A1* | 3/2017 | Raghupathy | H03H 19/004 |
| 2017/0331432 A1* | 11/2017 | Zhang | H03F 3/005 |
| 2018/0309364 A1* | 10/2018 | Bawa | H02M 3/156 |
| 2019/0044489 A1* | 2/2019 | Frasch | H03F 3/45475 |

* cited by examiner

ON-CHIP EMULATION OF LARGE RESISTORS FOR INTEGRATING LOW FREQUENCY FILTERS

CROSS REFERENCE TO RELATED APPLICATIONS

This claims the benefits of Provisional Application No. 62/211,374, filed on Aug. 28, 2015, the disclosure of which is incorporated by reference in its entirety.

BACKGROUND

There are many different markets and applications that require integration of ultra large resistors (>tens of Mega Ohms) in an area-efficient manner, while also achieving as low a variation as possible in the value of the resistance, without having to resort to trimming techniques. In an analog system, this requirement can be anywhere in the chip, either at the boundaries to the external world or deep inside. For simplicity and ease of understanding, an example of a single-ended to differential conversion architecture using a well-known instrumentation amplifier topology is used for illustration.

FIG. 1 shows a schematic block diagram (100) of a single-ended to differential conversion Instrumentation Amplifier architecture (105). As shown in this example, this system may comprise the first and second amplifiers (103 and its symmetrical counterpart at the bottom 103a). The input of the first amplifier (103) is AC coupled to a single-ended voltage $V_{IN}$ (112) through the large external capacitor $C_{HPF}$ (101), and the input of the second amplifier (103a) is coupled to an AC ground voltage. The first and second amplifiers (103 and 103a) are biased by a common-mode voltage $V_{CM}$ (104), through a resistor $R_{HPF}$ (102). The differential outputs $V_{OUTP}$ (106) and $V_{OUTM}$ (107) are generated through the symmetric feedback network comprising $R_1$ (109,110) and $R_2$ (108). The final output of this system is the differential voltage $V_{OUT\_DIFF}$ (111), that is then sent out to the next stage in the signal chain for further processing. Such processing usually involves an Analog to Digital Conversion (ADC) operation.

There are several applications that require this kind of processing of the input signal $V_{IN}$ (112) for pre-amplification before being converted into the digital domain for further processing. The voltage gain at the differential output (111) is given by the expression $$G = \left(\frac{V_{outp} - V_{outm}}{V_{in}}\right) = \left(1 + 2\frac{R_1}{R_2}\right)$$

and can be conveniently set by adjusting the resistor ratio, as desired. The symmetrical nature of this solution makes it a highly preferred pre-amplification stage for several applications, requiring conversion of a single-ended input signal to a differential output.

A typical example of such a system is in an audio microphone input path, where the analog microphone signal is generated with respect to the headset jack ground. For the rest of this description, this microphone example will be used to illustrate embodiments of the invention, so that the concept is clear. However, the exact same arguments/considerations are applicable in other low frequency systems as well, such as medical applications and any other type of applications/circuits that require very large on-chip resistors.

As the microphone can be biased at different levels, depending on manufacturer requirements, the input is usually ac-coupled onto the audio chip, so that the rest of the Analog Front End (AFE) can independently set the common-mode at an appropriate level to enable proper operation.

The input decoupling happens through the high pass filter formed by $C_{HPF}$ (101) and $R_{HPF}$ (102). For medical systems, this pole can be of the order of a few Hz, while for microphone signals, the pole can be in the 10 Hz range. Traditionally, this has been achieved easily using an external Printed Circuit Board (PCB) decoupling capacitor on the order of a few µF, and either using an external resistor or integrating on-chip a resistor that is in the range of 10 KΩ, depending on the required precision of the pole location.

In today's Internet Of Things (IoT) era, with the proliferation of the number of channels that need to be processed and the push towards using advanced digital silicon nodes (such as 20 nm and smaller geometries) for maximum feature integration and higher speed in the digital cores and Physical Layers Interfaces, using 2 sets of external capacitors for each channel has become prohibitive to customers, in terms of Build Of Materials (BOM) cost and, more importantly, PCB space, as the form factors of hand-held and wearable devices are ever shrinking. This has led many leading manufacturers to go for integrated solutions that eliminate these external components, while still driving for very low chip costs.

In the next section, the existing solutions to meeting these requirements are explained, while highlighting their limitations.

PRIOR ART

A current solution (200), as shown in FIG. 2, achieves these requirements by integrating a filter capacitor $C_{HPF}$ (201) on the order of a few hundred pF, with the corresponding filter resistor $R_{HPF}$ (202) working out to be a few hundreds of Mega ohms, to achieve a pole location of a few tens of Hz. However, such solutions presume the availability of high sheet-resistance polysilicon resistors in the process node of choice. More importantly, these solutions require a very large die area for the resistors. The rest of the system comprises elements (203) through (212), corresponding to the elements discussed in FIG. 1.

To illustrate the above problem in a quantitative manner, let us look at one example with representative values: 100 pF and 163 MΩ for a 10 Hz pole. The capacitor is usually of this magnitude and is determined by the integrated noise at the input that can be tolerated in the system given by the $$\left(\frac{kT}{C}\right)$$

noise budget. Typical sheet resistance in advanced nodes (such as 20 nm) is about 250-300 Ω/square, with minimum resistor widths of 0.5 µm or so. Using these numbers, we arrive at a resistor area of 0.27 mm² for each channel being added (excluding the capacitors and the rest of the circuitry). In the event that only low density metal capacitors are available (100 pF for the capacitor in this example is quite a luxury), the resistance required would be much higher. For most customers, such a solution becomes prohibitive in cost, not to mention the variations in the pole location that can be as high as 100% due to independent variations of the resistor and capacitor over process/temperature and mismatch corners.

Prior art solutions to implement such large resistors with a goal to reduce the area impact discussed above include reverse biased diodes (213), transistors "diode connected" (214), or even sub-threshold biased transistors, as discussed in U.S. Pat. No. 5,999,043, issued to Zhang et al., Reza Abdullah, Edgar Sanchez-Sinencio, "*A biopotential amplifier with dynamic capacitor matching for improved CMRR,*" Analog Integr. Circ. Sig. Process., (2015) 82:47-55, DOI 10.1007/s10470-014-0448-0, and Chengliang Qian, Jordi Parramon, and Edgar Sanchez-Sinencio, "*A Micropower Low-Noise Neural Recording Front-End Circuit for Epileptic Seizure Detection,*" IEEE JOURNAL OF SOLID-STATE CIRCUITS, VOL. 46, NO. 6, JUNE 2011. Other reasons for trying these methods may be because the process node of choice does not have sheet resistors available for use or requires special extra masks to be ordered, which may be cost prohibitive. However, these approaches have the following limitations:
 1. Increased risk of leakage current errors due to parasitic transistors that come inherently with these diodes, especially at high temperatures above 100° C. Even a 10 pA leakage at the node (216) can cause an input offset of 1.63 mV for the case under consideration. This input offset would get amplified by the amplifier gain and could possibly saturate the next stage in the signal chain, due to the large gains that are usually required for good channel signal to noise ratio (SNR). This leakage induced error is a problem even for other applications
 2. Uncontrollability of the reverse biased off impedance, because this is determined by process recipe (such as doping) to a large extent
 3. Large variability in the off impedance over process and especially temperature corners, leading to big variations in the pole location being implemented (much more than the case of a physical resistor as explained in the previous paragraph), causing performance issues at the circuit level
 4. Voltage swing limitations on the input signal to be within a diode drop on both polarities, so as to avoid clipping the input signal appearing at the error amplifier (203) input node (216)
 5. Variations of the impedance with input signal swing due to the modulating effects on the gate bias, thereby causing non-linear filtering of the input, which is highly undesirable Some other prior art approaches have also been tried, such as using long channel transistors (215) to implement the large resistance to address the area impact mentioned above. However, these approaches usually suffer from the following limitations:
 1. Increased impedance variations due to additional susceptibility to bias variations ($V_{GS}$) because of common-mode (204) shifts, on top of the process and temperature variations of the transistor parameters.
 2. Increased risk of leakage current induced voltage drops, as mentioned above, due to the presence of parasitic junctions inherent to the transistor
 3. Variations of the impedance with input signal swing due to the modulating effects on the gate bias, thereby causing non-linear filtering of the input, which is highly undesirable U.S. Pat. No. 6,882,216 B2, issued to Kang, describes a more advanced variant of the above-mentioned techniques. This patent describes the use of servo-loop biased transistors to implement large resistors. However, the down side of this approach is the impact of the amplifier offset and the quiescent current required by the active circuits, which can be big detriments for some applications.

While these prior art approaches provide some solutions to the above problems, there is still a need for a better approach to alleviate or minimize some or all of the above described problems.

SUMMARY

In general, in one aspect, embodiments of the invention relate to novel architectures and methods to integrate ultra large resistance on-chip using a minimal die area. In accordance with some embodiments of the invention, an architecture and method to implement the resistance may use switched capacitor techniques, by choosing the capacitor value and switching speed as needed.

In accordance with embodiments of the invention, a system for processing of signals with poles that are low in frequency includes a switched capacitor circuit comprising two switches connected to an input and an output of a switching capacitor ($C_s$), respectively, in an alternating manner at a selected switching frequency ($f_{SW}$); and a filter capacitor connected between an input and the switched capacitor circuit, wherein the filter capacitor and the switched capacitor circuit together function as a filter, thereby a pole frequency depending on a ratio of capacitance of the switching capacitor ($C_s$) and the filter capacitor.

In general, in one aspect, embodiments of the invention relate to novel architectures and methods to integrate ultra large resistance on-chip while minimizing the variations of the associated filter pole time constants with process, supply voltage, bias voltage and temperature. In accordance with embodiments of the invention, architectures and methods to implement the resistance use switched capacitor techniques, so that the resulting filter pole time constant is determined by a capacitance ratio, rather than a RC product. In general, a pole frequency in accordance with embodiments of the invention is in a relatively low range, typically below a thousand Hz, preferably below a hundred Hz, more preferably around 10 Hz or lower. Therefore, a variation of the pole frequency may be 100 Hz or lower, more preferably 10 Hz or lower.

In general, in one aspect, embodiments of the invention relate to novel architectures and methods to integrate ultra large resistance on-chip while minimizing the variations of the associated filter pole time constants with input signal swing. In accordance with embodiments of the invention, architectures and methods to implement the resistance use switched capacitor techniques, so that the implemented resistance value is independent of the switch resistances of the switched capacitor circuit and is only dependent on the switching capacitor value and switching speed.

In general, in one aspect, embodiments of the invention relate to novel architectures and methods to integrate ultra large resistance on-chip while minimizing the impact of leakage currents on the associated analog circuitry. In accordance with embodiments of the invention, architectures and methods to implement the resistance use switched capacitor techniques, so that the implemented resistance doesn't physically have a large resistance anywhere in the circuit, which can have large IR losses due to even small leakage currents.

In general, in one aspect, embodiments of the invention relate to novel architectures and methods to integrate ultra large resistance on-chip while minimizing the switching noise impact on the associated analog circuitry. In accordance with embodiments of the invention, architectures and methods may ensure that the switching noise is greatly attenuated by the ratio of the switching capacitor to the associated filter pole setting capacitor, which is orders of magnitude larger in comparison to the switching capacitor.

BRIEF DESCRIPTION OF DRAWINGS

The appended drawings illustrate several embodiments of the invention and are not to be considered limiting of its scope, for the invention may admit to other equally effective embodiments

DETAILED DESCRIPTION

Figure 1:
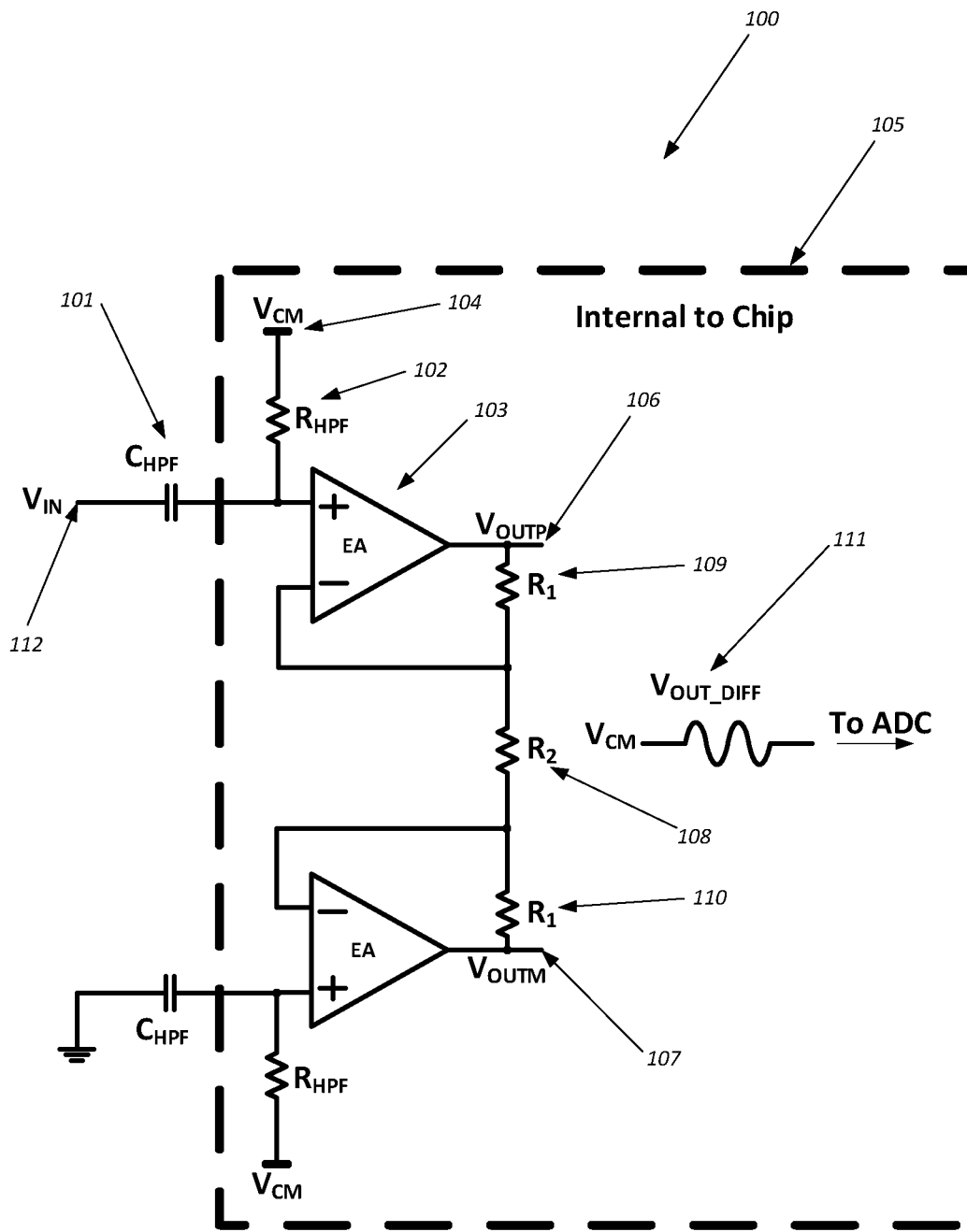
FIG. 1 shows a generic single-ended to differential conversion instrumentation amplifier with ac coupled inputs using external off chip components

Aspects of the present disclosure are illustrated in the above-identified drawings and are described below. In the description, like or identical reference numerals are used to identify common or similar elements. The drawings are not necessarily to scale and certain features may be shown exaggerated in scale or in schematic in the interest of clarity and conciseness.

Embodiments of the invention relate to innovative solutions, which address some or all of the above-mentioned limitations in the prior art and result in a robust solution to the requirement at hand, while also occupying significantly less die area. Embodiments of the invention achieve this by using a switched capacitor scheme to effectively implement a large resistor. Emulating a resistor using a switched capacitor circuit to implement ultra large resistances enables integration of large external input de-coupling capacitors. Embodiments of the invention result in several benefits and make it viable at a system level, when it otherwise might not be possible.

Specifically, embodiments of the invention use novel architectures and methods to integrate ultra large resistance on-chip. In the following description, details of embodiments of the invention are illustrated with reference to the drawings. One skilled in the art would appreciate that specific examples described are for illustration only and other modifications and variations are possible without departing from the scope of the invention.

Figure 2:
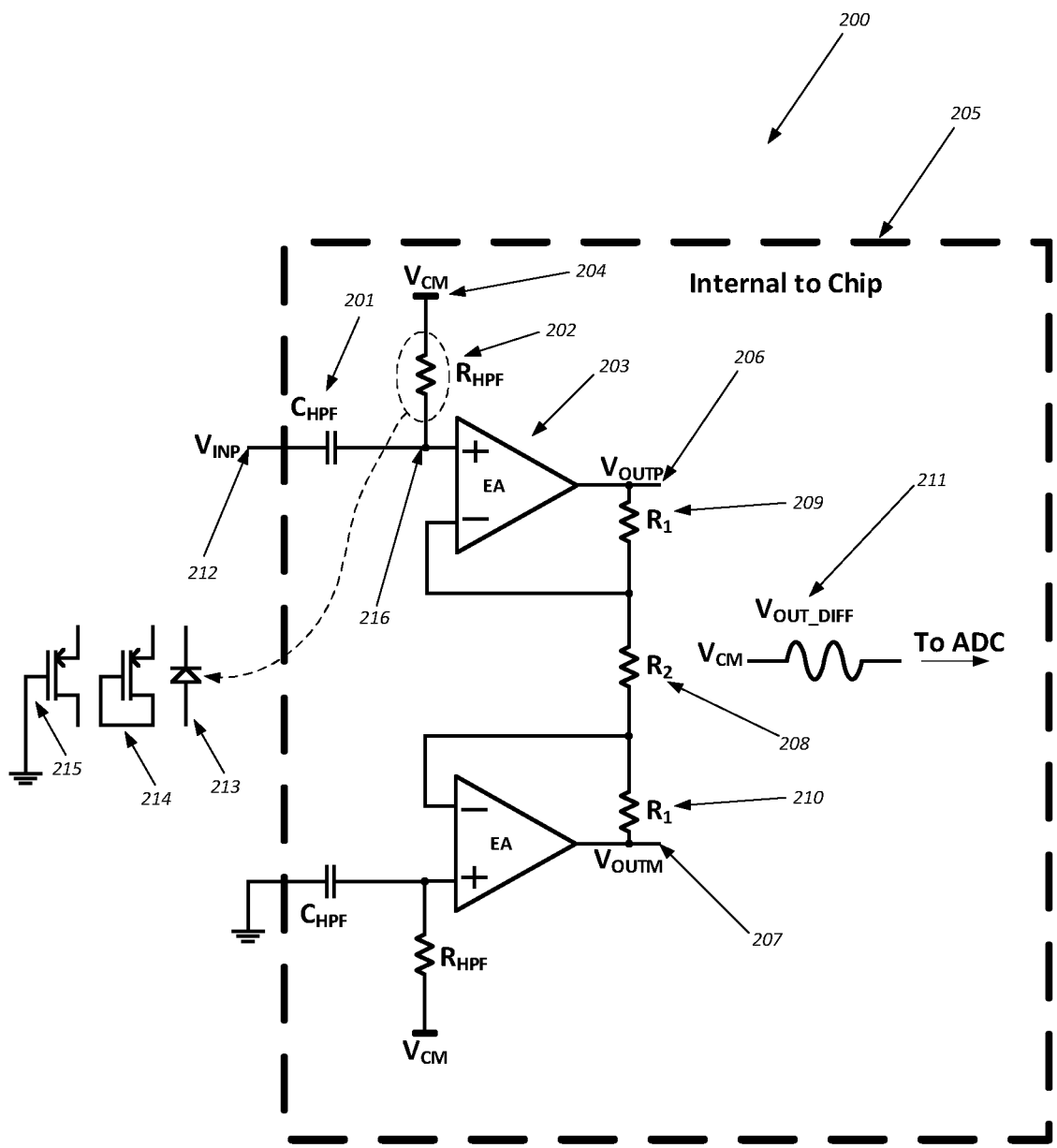
FIG. 2 shows the current state of the art single-ended to differential conversion instrumentation amplifier with AC coupled inputs using integrated on chip components
Figure 3:
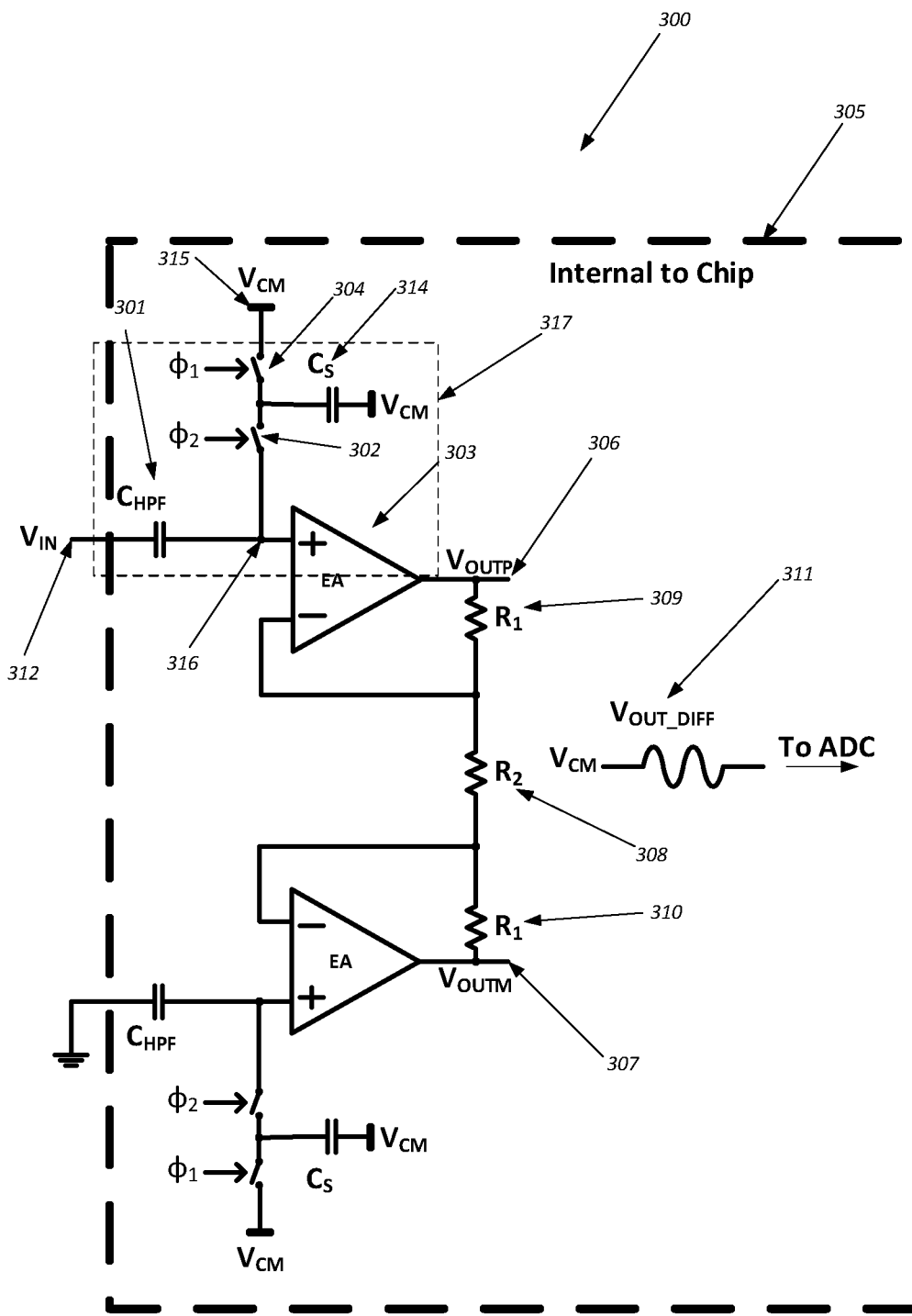
FIG. 3 shows a single-ended to differential conversion instrumentation amplifier with ac coupled inputs using integrated on chip components, using switched capacitor techniques to emulate ultra large resistors in accordance with one embodiment of the invention.

FIG. 3 describes an exemplary embodiment (300) of the invention. As shown in FIG. 3, the topology of an integrated input de-coupling filter block (317), which uses a filter capacitor $C_{HPF}$ (301) and a switched capacitor network that comprises switches (302 and 304) and a capacitor $C_S$ (314) to effectively implement a large filter resistor (equivalent to the resistor $R_{HPF}$ (202) in FIG. 2), as opposed to the techniques explained previously in the prior art section. In other words, two switches (302 and 304) in conjunction with the capacitor Cs (314) in FIG. 3 function as an equivalent of the large filter resistor $R_{HPF}$ (202) in FIG. 2.

In this description, a "switched capacitor network" functions as a switched capacitor resistor. The switched capacitor resistor is made of a switching capacitor C (shown as $C_s$ in FIG. 3) and two switches $\phi_1$ and $\phi_2$ (shown as 302 and 304 in FIG. 3) that alternately connect with the capacitor $C_s$ at a given frequency (switching frequency $f_{SW}$) to the input and output sides of the capacitor $C_s$.

In accordance with embodiments of the invention, a switched capacitor circuit effectively implements a large filter resistor (equivalent to the resistor $R_{HPF}$ (202) in FIG. 2). This may be termed an "ultra large resistor," which has a resistance of mega ohms or higher (MΩ), preferably greater than 10 MΩ, and more preferably greater than 100 MΩ.

The operating principle of this solution is explained in the next section. In addition, how the solution overcomes some or all of the limitations in the prior art approach will be highlighted. As will be seen later, our proposed solution allows us to integrate all the elements needed on-chip (305), without requiring any external off-chip components. The rest of the system comprises the elements (306) through (312), corresponding to those described in FIG. 2.

By alternatively switching the capacitor $C_S$ (314) from the common-mode voltage $V_{CM}$ (315) to the error amplifier (303) input terminal (316) at a frequency $f_{SW}$ that is at least twice the band of interest, the DC voltage at the node (316) gets eventually set to the desired common-mode $V_{CM}$ (315), exhibiting a first order exponential settling response, characteristic of a low pass filter, with a time constant that is effectively determined by $$\tau = \left(\frac{1}{f_{SW}C_S}\right)C_{HPF}.$$

Once the steady-state operation is reached, the same time constant is in effect with respect to the input signal $V_{IN}$ (312), the only difference being that it appears as a high pass filter response, providing the required de-coupling from the input signal. It is easy to see from the above equation for T that the $R_{HPF}$ described earlier (see 202 in FIG. 2) is effectively given by $$R_{HPF} = \left(\frac{1}{f_{SW}C_S}\right).$$

Now that we have described the operation of the circuit, we will describe the decisive advantages of this scheme in the next few paragraphs.

First, let us look at the area savings. An exemplary calculation with a switching frequency of 20 KHz (at the edge of the audio band and easily >2× the max microphone signal band of 7 KHz or so) shows that we would require a $C_S$ of 307 fF, to realize 163 MΩ effectively. Assuming a metal capacitor density of 0.2 fF/μm² that is a good representation of Integrated Circuit (IC) processes, this translates into an area of 3000 μm² (0.003 mm²) for 2 capacitors, one for either side. Comparing this with the 0.27 mm² arrived at earlier, we can see that there is an area saving of almost 100×.

Second, by looking at the expression for the time constant τ, it is to be noted that it only depends on the capacitance ratio of $C_{HPF}$ to $C_S$ and the switching frequency $f_{SW}$. While the switching frequency is a precise and stable parameter, derived from either a Real Time Clock (RTC system) or from a system clock in audio systems (accurate to <1% drift), it is a well-known fact in the analog world that capacitor ratios can be made to match precisely with careful layout techniques to <1%. Thus, it is evidently clear that the pole location of the desired filtering is as accurate as it can ever get (easily within a few percent), with an improvement of at least 10×, if not more, over current state of the art, thereby setting this solution on a pedestal far above the current state of the art explained previously.

It can be gleaned by analysis of the switched capacitor circuit formed by switches (302), (304) and capacitor $C_S$ (314) that the effective impedance of this network largely depends on the switching frequency ($f_{SW}$) and the value of $C_S$ and can be made independent of the impedance of the switches (302) and (304) by sizing them appropriately. Therefore, even if the switch impedance of (302) changes with the input signal, it does not impact the filter pole location mentioned above, thereby removing the non-linear filtering effect limitation that was described earlier in the prior art section. This is a highly preferred aspect of our solution as well. It should be mentioned here that practical implementation considerations will limit how low the value of $C_S$ is made. One skilled in the art would be able to determine this value for the desired outcome.

Finally, the sensitivity of the proposed solution to leakage current losses at the node (316) is also very low, another significant aspect of our solution. For example, in the event of a 10 pA leakage loss for half the switching period, the resulting voltage drop is only 2.5 μV, as compared to the 1.63 mV error of the prior art solutions. Further, this error never accumulates, as in the next clock cycle, it is provided from the common-mode node by the $C_S$. Again, an overall improvement of over 500× is achieved, as compared to current state of the art. In fact, from this perspective, the solution provided by embodiments of the invention is probably the only one that can perform correctly in the presence of leakage losses. In contrast, the prior art solutions pretty much break down at even moderate leakages (common in advanced CMOS process nodes).

With regards to potential issues due to switching noise propagating to the outputs, it is to be noted that the proposed topology is architected in such a way that any such noise is a common-mode signal to the instrumentation amplifier system and is therefore rejected at the differential output (311) of the amplifier by the Common-Mode Rejection Ratio (CMRR) of the system, which is typically high (>60 dB). While this aspect is common to the prior art as well, the uniqueness of our solution lies in the extra attenuation to the injected switching noise into the amplifier inputs. Circuit analysis shows that this attenuation factor, to a first order, is given by $$\left(\frac{C_{HPF}}{C_S}\right),$$

which in our case is about 50 dB. Thus, the overall rejection to this noise at the instrumentation amplifier output is >110 dB, which is extremely high. As a result, the solution provided by embodiments of the invention is very immune to switching noise, which makes it very attractive. For these reasons, in preferred embodiments of the invention, the capacitance of the filter capacitor ($C_{HPF}$) is substantially larger (e.g., 100 times greater or more) than that of the switching capacitor ($C_S$). In this context, "substantially larger" means at least 10 times, preferably at least 30 times, more preferably at least 100 times, and most preferably at least 300 times.

Thus, in accordance with embodiments of the invention, the proposed architecture has been shown to provide a significantly superior and competitive product by eliminating some or all of the limitations of the prior art, and even making a solution viable, when it otherwise might not be. Embodiments of the invention are unique in that they adapt and apply a known circuit technique in a larger system level scenario in a way that has never been done before, to repeat the benefits that are so valuable in terms of the overall customer requirements at a product level.

Embodiments of the invention may have one or more of the following advantages: embodiments of the invention allow one to implement ultra large resistance and easily integrate on chip external ac de-coupling capacitors. Embodiments of the invention may be used to implement filters in the range of few Hz up to few tens of Hz, while still resulting in a robust, well controlled solution. Embodiments of the invention also have the added merits of requiring much less silicon areas, as compared to the current state of the art.

It is to be noted that embodiments of the invention described herewith are equally applicable to low frequency systems other than audio, where similar architectural requirements are to be met, though the numbers to be implemented might be of a different magnitude.

While embodiments of the invention have been illustrated with a limited number of examples, one skilled in the art would appreciate that other modifications and variations are possible without departing from the scope of the invention. Therefore, the scope of the invention should be limited only by the attached claims.

What is claimed is:

1. A system for processing of signals with poles that are low in frequency, comprising:
   a switching capacitor circuit network comprising two switches connected to an input and an output of a switching capacitor ($C_s$), respectively, in an alternating manner at a selected frequency ($f_{SW}$), wherein the switching capacitor circuit network is connected to a common mode reference of the system and is used for fixing a DC bias level of the system; and
   a filter capacitor ($C_{HPF}$) connected between an input and the switching capacitor circuit network, wherein the filter capacitor and the switching capacitor circuit network together function as a fully integrated on-chip filter,
   thereby resulting in a pole frequency depending on a ratio of capacitance of the switching capacitor circuit network and the filter capacitor ($C_{HPF}$), wherein a capacitance of the filter capacitor is substantially larger than a capacitance of the switching capacitor,
   wherein the system is fully integrated on chip using an advanced process node of ≤20 nm.

2. The system of claim 1, wherein the capacitance of the filter capacitor is 100 times or more larger than the capacitance of the switching capacitor.

3. The system of claim 1, wherein a resulting pole frequency variation, which varies with process, bias voltage, and temperature, is 10 Hz or lower.

4. The system of claim 1, wherein a resulting pole frequency variation with input signal swing is removed, thereby providing a linear filtering.

5. A method for implementing ultra large resistance on-chip without physical use of a resistor component that is sensitive to pA levels of leakage and that is either not available in advanced process nodes ≤20 nm or prohibitive in die area cost due to lack of high sheet resistance components, to allow integration of a large external de-coupling capacitor for realizing a fully integrated on-chip filter pole that is low in frequency, comprising;

a. using a switching capacitor circuit network to implement the ultra large resistor, wherein the switching capacitor circuit network comprises two switches connected to an input and an output of a switching capacitor ($C_s$), respectively, in an alternating manner at a selected frequency ($f_{SW}$), wherein the switching capacitor circuit network is connected to a common mode reference of a system and is used for fixing a DC bias level of the system, and wherein a filter capacitor ($C_{HPF}$) is connected between an input and the switching capacitor circuit network; and b. setting a pole frequency to be a function of a ratio of capacitance of the filter capacitor ($C_{HPF}$) and the switching capacitor ($C_s$), instead of a RC product, wherein a capacitance of the filter capacitor is substantially larger than a capacitance of the switching capacitor, thereby attenuating an impact of switching noise by the ratio of capacitance of the capacitors.

6. The method of claim 5, wherein the capacitance of the filter capacitor is 100 times or more larger than the capacitance of the switching capacitor.

7. The method of claim 5, wherein a resulting pole frequency variation, which varies with process, bias voltage, and temperature, is 10 Hz or lower.

8. The method of claim 5, wherein a resulting pole frequency variation with input signal swing is removed, thereby providing a linear filtering.

* * * * *